US008495476B2

United States Patent
Abu-Surra et al.

(10) Patent No.: US 8,495,476 B2
(45) Date of Patent: Jul. 23, 2013

(54) SYSTEM AND METHOD FOR CODING AND INTERLEAVING FOR SHORT FRAME SUPPORT IN VISIBLE LIGHT COMMUNICATION

(75) Inventors: Shadi Abu-Surra, Richardson, TX (US); Sridhar Rajagopal, Plano, TX (US); Eran Pisek, Plano, TX (US)

(73) Assignee: Samsung Electronics Co., Ltd, Suwon-Si (KR)

( * ) Notice: Subject to any disclaimer, the term of this patent is extended or adjusted under 35 U.S.C. 154(b) by 269 days.

(21) Appl. No.: 12/962,324

(22) Filed: Dec. 7, 2010

(65) Prior Publication Data

US 2011/0154155 A1      Jun. 23, 2011

Related U.S. Application Data

(60) Provisional application No. 61/306,870, filed on Feb. 22, 2010, provisional application No. 61/307,045, filed on Feb. 23, 2010, provisional application No. 61/284,376, filed on Dec. 17, 2009.

(51) Int. Cl.
    *G06F 11/00*      (2006.01)
(52) U.S. Cl.
    USPC .......................................... 714/784; 714/790

(58) Field of Classification Search
    USPC .......................... 714/752, 756, 781, 784, 790
    See application file for complete search history.

(56) References Cited

U.S. PATENT DOCUMENTS

| | | | | |
|---|---|---|---|---|
| 6,397,368 | B1 * | 5/2002 | Yonge et al. | 714/792 |
| 7,636,878 | B2 * | 12/2009 | Yoon et al. | 714/774 |
| 8,352,843 | B2 * | 1/2013 | Chrabieh et al. | 714/790 |
| 2008/0065948 | A1 * | 3/2008 | Eroz et al. | 714/752 |
| 2009/0241006 | A1 * | 9/2009 | Liikanen et al. | 714/752 |
| 2010/0077276 | A1 * | 3/2010 | Okamura et al. | 714/752 |
| 2010/0218066 | A1 * | 8/2010 | Okamura et al. | 714/752 |
| 2010/0306618 | A1 * | 12/2010 | Kim et al. | 714/755 |
| 2011/0197104 | A1 * | 8/2011 | Nimbalker et al. | 714/752 |

* cited by examiner

*Primary Examiner* — Marc Duncan

(57) ABSTRACT

A transmitter is capable of performing both Galois Field (GF) (16) and GF (256) encoding in a visual light communication system. The transmitter includes a GF (256) encoder. The transmitter also includes a first bit mapper configured to map a first number of bits to a second number of bits. The Galois Field (256) encoder is configured to receive and encode the second number of bits. The transmitter also includes a second bit mapper configured to map the second number of bits to the first number of bits. The transmitter also includes an interleaver unit that can pad bits based on a frame size and puncture the bits after interleaving and prior to transmission.

21 Claims, 8 Drawing Sheets

SYSTEM AND METHOD FOR CODING AND INTERLEAVING FOR SHORT FRAME SUPPORT IN VISIBLE LIGHT COMMUNICATION

CROSS-REFERENCE TO RELATED APPLICATION(S) AND CLAIM OF PRIORITY

The present application is related to U.S. Provisional Patent Application No. 61/306,870, filed Feb. 22, 2010, entitled "INTERLEAVER DESIGN FOR SHORT PACKET SUPPORT IN VISIBLE LIGHT COMMUNICATION"; U.S. Provisional Patent Application No. 61/307,045, filed Feb. 23, 2010, entitled "INTERLEAVER DESIGN FOR SHORT PACKET SUPPORT IN VISIBLE LIGHT COMMUNICATION"; and U.S. Provisional Patent Application No. 61/284,376, filed Dec. 17, 2009, entitled "FEC SCHEME COMPATIBLE WITH THE VLC 4B6B AND 8B10B LINE CODE". Provisional Patent Application Nos. 61/306,870, 61/307,045, and 61/284,376 are assigned to the assignee of the present application and is hereby incorporated by reference into the present application as if fully set forth herein. The present application hereby claims priority under 35 U.S.C. §119(e) to U.S. Provisional Patent Application Nos. 61/306,870, 61/307,045, and 61/284,376.

TECHNICAL FIELD OF THE INVENTION

The present application relates generally to visible light communication and, more specifically, to a forward error correction (FEC) scheme and interleaver for use in a visible light communication system.

BACKGROUND OF THE INVENTION

Visible light communication is a new technology for short-range optical wireless communications using visible light in optically transparent media. This technology provides access to several hundred terahertz (THz) of unlicensed spectrum; immunity to electromagnetic interference and noninterference with Radio Frequency (RF) systems; additional security by allowing the user to see the communication channel; and communication augmenting and complementing existing services (such as illumination, display, indication, decoration, etc.) from visible-light infrastructures.

SUMMARY OF THE INVENTION

A transmitter capable of performing Galois Field (GF) (16) and GF (256) encoding is provided. The transmitter includes a Galois Field (256) encoder. The transmitter also includes a first bit mapper configured to map a first number of bits to a second number of bits. The Galois Field (256) encoder is configured to receive and encode the second number of bits. The transmitter also includes a second bit mapper configured to map the second number of bits to the first number of bits.

A method for performing Galois Field (GF) (16) and GF (256) encoding is provided. The method includes mapping a first number of bits to a second number of bits; performing a Galois Field (256) encoding operation on the second number of bits; and mapping the second number of bits to the first number of bits.

A transmitter capable of performing Galois Field (GF) (16) and GF (256) encoding is provided. The transmitter includes a Reed Solomon (RS) encoder and an interleaver unit. The interleaver unit is configured to receive, from the RS encoder, a plurality of symbols as a plurality of codewords. The interleaver unit includes a pad block configured to add a number of bits to at least one codeword based on a frame size of the plurality of symbols. The interleaver unit also includes a block interleaver configured to interleave the plurality of codewords; and a puncture block configured to puncture a number of bits based on the frame size.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
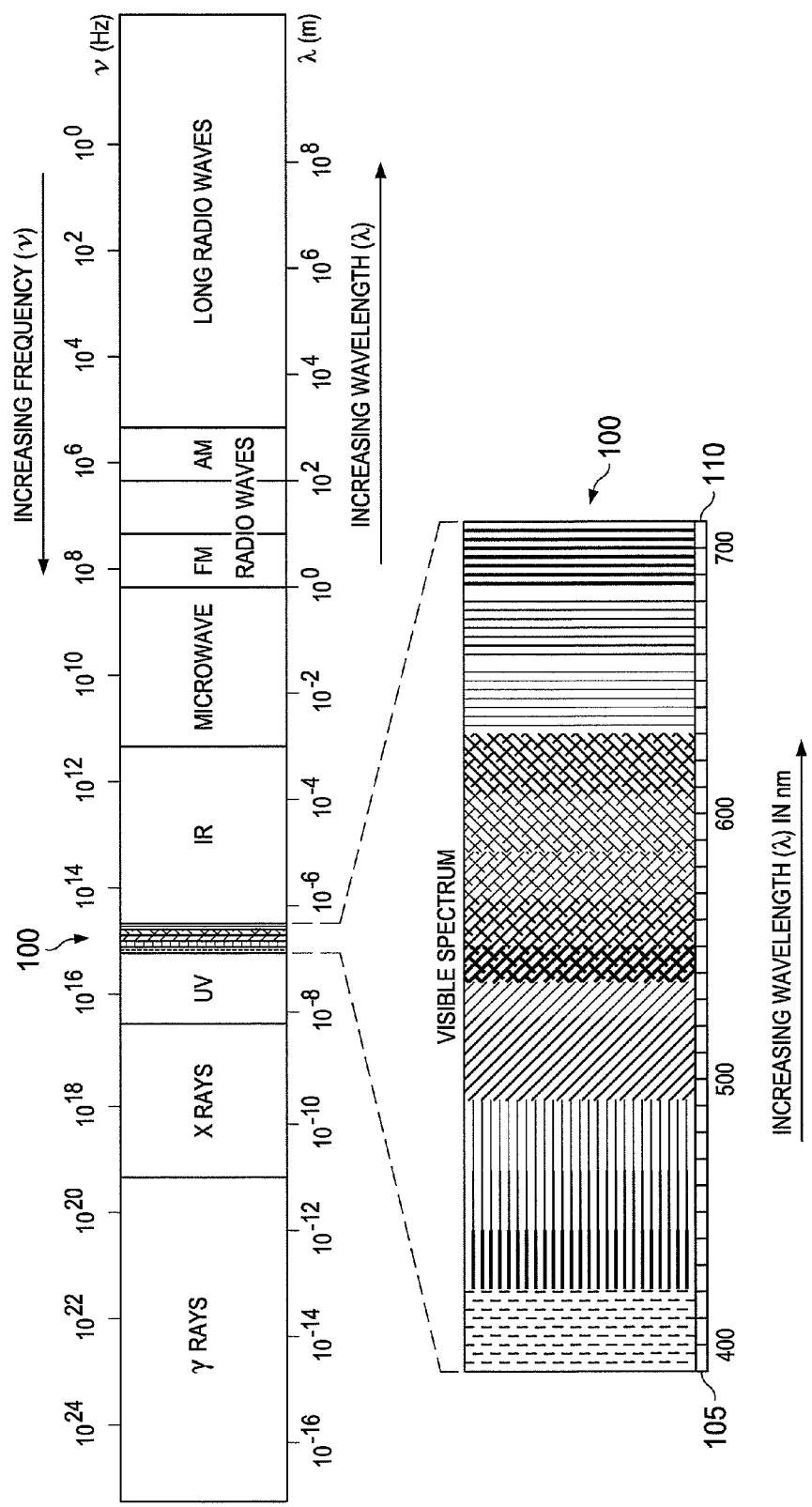
FIG. 1 illustrates a frequency spectrum and wavelengths occupied by visible light.

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

In the IEEE 802.15.7, the contents of which are hereby incorporated by reference, 4B6B and 8B10B line-code are used to achieve DC balance and clock recovery properties for the transmitted data. For practical considerations, both properties are necessary to build reliable visible light communication system. The 4B6B line code is a constraint code that maps every 4 bits at its input into 6 bits at its output. The 8B10B line-code is another constraint code that maps every 8 bits at its input into 10 bits at its output.

Due to channel noise and/or transceiver's circuit faults many transmission errors occur. To improve the performance of the system in such environment an outer forward error correcting (FEC) scheme is utilized. The FEC is configured to be compatible with the line-code (the inner code). The 4B6B and the 8B10B line-codes output 6-bits and 10-bits symbols, respectively. Therefore, the channel is no longer a binary channel.

For example, consider the 4B6B line-code. Every 6 bits at the output of the line-code encoder represents a line-code symbol. As such, an error in any of the 6 bits will corrupt the entire symbol, which will result in losing all 4 bits at the output of the line code decoder. Therefore, a non-binary FEC code, such as Reed-Solomon code can better to match the channel.

A Reed-Solomon code can be viewed as a BCH code constructed over a finite field of size q, Galois Field, GF(q), as follows: when n=q−1 and $\alpha$ is a primitive element in GF(q). For a given k, $1 \leq k<n$, the (n, k) Reed-Solomon code over GF(q) has a codeword $(f_0, f_1, \ldots, f_{n-1})$ if and only if $\alpha$, $\alpha^2, \ldots, \alpha^{n-k}$ are roots of the polynomial $p(x)=f_0+f_1 x+ \ldots +f_{n-1}x^{n-1}$. The generator polynomial g(x) is the minimal polynomial with roots $\alpha, \alpha^2, \ldots, \alpha^{n-k}$, and the codewords are exactly the polynomials that are divisible by g(x). This code has a minimum distance n−k+1, and so it can correct a multiple errors and erasures as long as the number of errors, e, and the number of erasures, r, satisfy 2e+r<n−k. An (n, k) Reed-Solomon code can be shortened by l, l<k, symbols to construct a (n−l, k−l) shortened Reed-Solomon code. This shortened code can also correct a collection of errors and erasures which satisfy 2e+r<n−k.

In some embodiments of the present disclosure a Reed-Solomon codes, which are constructed over the finite field GF (16), are used as an outer code for the 4B6B inner line-code. In some embodiments, Reed-Solomon codes, which are constructed over GF (256), are used as an outer code for the 8B10B inner line-code. In some embodiments provide a method for using the Reed-Solomon encoder and decoder circuit to encode and decode both GF (16) and GF (256) Reed-Solomon codes. Finally, the error detection capabilities of the line-codes are used to enhance the performance of Reed-Solomon codes by passing erasure information to the Reed-Solomon decoder.

FIG. 1 illustrates a frequency spectrum and wavelengths occupied by visible light. The visible light spectrum 100 extends from 380 nanometers (nm) 105 to 780 nm 110 in wavelength. Since this spectrum 100 is large and can support light sources with multiple colors, visible light communication can provide multiple channels for communication.

Figure 2A:
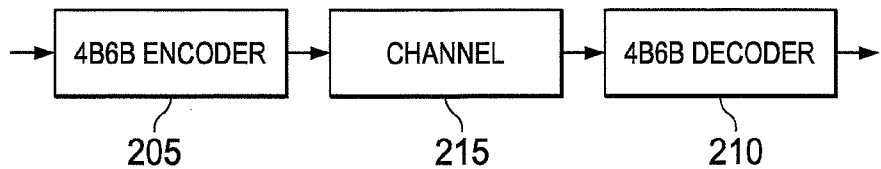
FIGS. 2A and 2B illustrate a four-bit to six-bit (4B6B) line code as a discrete 16-ary channel according to the present disclosure.
Figure 2B:
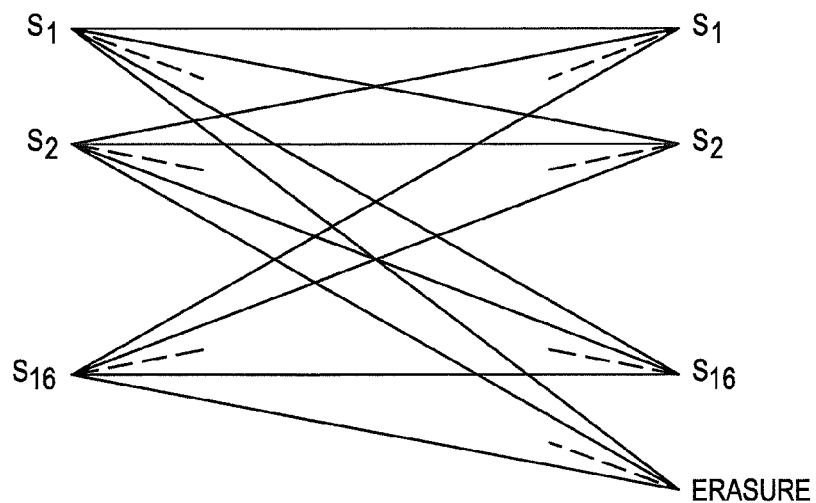

FIGS. 2A and 2B illustrate a four-bit to six-bit (4B6B) line code as a discrete 16-ary channel according to the present disclosure. As discussed above, when line-code is used the binary channel model is no longer valid. In the case of 4B6B line-code, the data path 200 from the input of the 4B6B line-code encoder 205 to the output of the 4B6B line-code decoder 210 can be modeled as discrete 16-ary channel with an erasure. The FEC code used for this channel 215 is a non-binary code based on the finite field GF (16). Embodiments of the present disclosure utilize a Reed-Solomon code that is built over GF (16) when the 4B6B line code is used.

Figure 3:
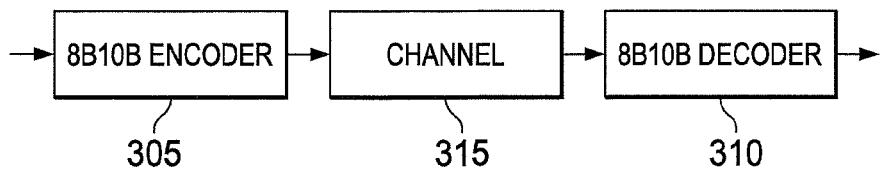
FIG. 3 illustrates an eight-bit to ten-bit (8B10B) line code as a discrete 256-ary channel according to the present disclosure.

FIG. 3 illustrates an eight-bit to ten-bit (8B10B) line code as a discrete 256-ary channel according to the present disclosure. Similarly, the data path from the input of the 8B10B line-code encoder 305 to the output of the 8B10B line-code decoder 310 can be modeled as discrete 256-ary channel with an erasure. The FEC code used for this channel 315 is a non-binary code based on the finite field GF (256). Embodiments of the present disclosure utilize a Reed-Solomon code that is built over GF (256) when the 8B10B line-code is used.

Figure 4:
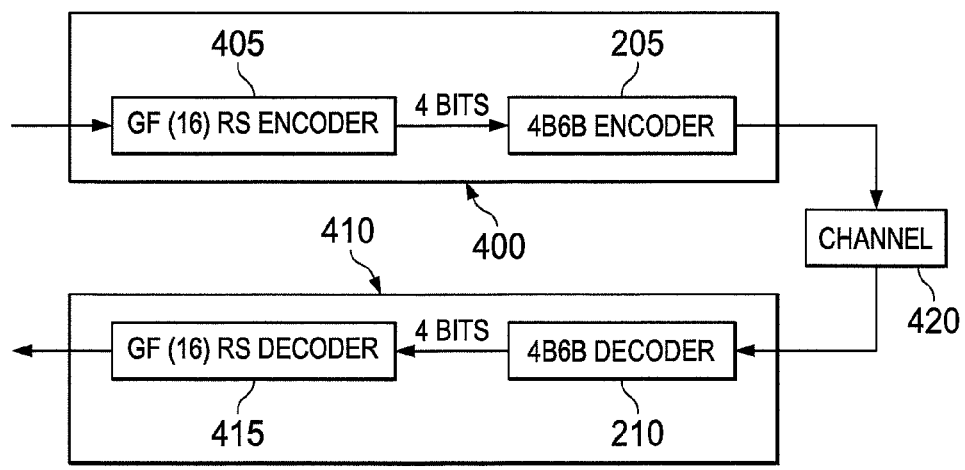
FIG. 4 illustrates a Reed-Solomon code and 4B6B concatenated scheme according to embodiments of the present disclosure.

FIG. 4 illustrates a Reed-Solomon code and 4B6B concatenated scheme according to embodiments of the present disclosure. The embodiment of the Reed-Solomon code and 4B6B concatenated scheme shown in FIG. 4 is for illustration only. Other embodiments could be used without departing from the scope of this disclosure.

In the example shown in FIG. 4, a transmitter 400 includes a GF (16) encoder 405 and a 4B6B encoder 205. In addition, a receiver 410 includes a 4B6B decoder 210 and a GF (16) RS decoder 415. The transmitter 400 communicates to the receiver 410 through channel 420. For example, the transmitter 400 and receiver 410 can communicate using visual light communication and the channel 420 can be within the visual light spectrum 100. The 4B6B line-code is an inner code. The performance of the following outer codes can be compared: 1) The (15, 12) Reed-Solomon code over GF (16) 405; and 2) the (15, 12) shortened Reed-Solomon code over GF (256) instead of GF (16) 405.

Figure 5:
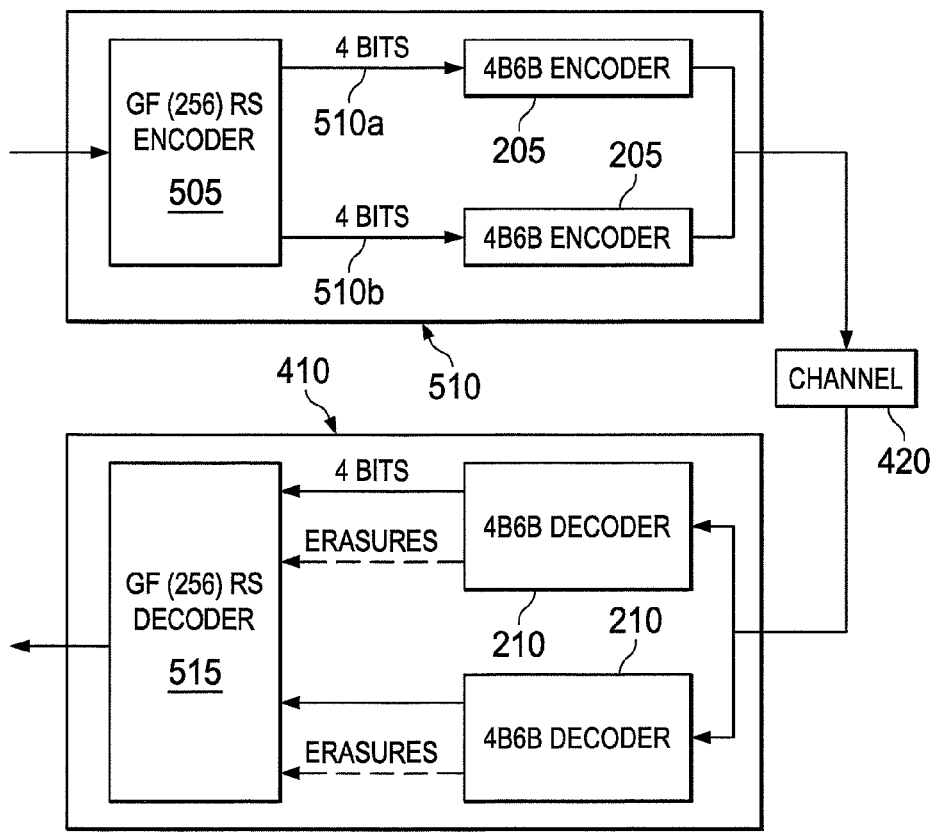
FIG. 5 illustrates a Reed-Solomon code and 4B6B with GF (256) concatenated scheme according to embodiments of the present disclosure.

FIG. 5 illustrates a Reed-Solomon code and 4B6B with GF (256) concatenated scheme according to embodiments of the present disclosure. The embodiment of the Reed-Solomon code and 4B6B with GF (256) concatenated scheme shown in FIG. 5 is for illustration only. Other embodiments could be used without departing from the scope of this disclosure.

The transmitter 400 includes a GF (256) encoder 505 and two 4B6B encoders 205. In addition, the receiver 410 includes two 4B6B decoders 210 and a GF (256) RS decoder 515. The transmitter 400 communicates to the receiver 410 through channel 420. For example, the transmitter 400 and receiver 410 can communicate using visual light communication and the channel 420 can be within the visual light spectrum 100.

In some embodiments, since the output of the GF (256) Reed-Solomon code encoder 505 is 8-bit symbols, each symbol is partitioned into two 4-bit symbols 510 prior to being input to the 4B6B line code encoders 210. However, if one bit in one of the 4-bit symbols 510 is corrupted, then the entire 8-bit symbol is corrupted. That is, if one bit in 510*a* is corrupted, then the 8-bit symbol that was partitioned into the two 4-bit symbols 510*a* and 510*b* is corrupted.

Figure 6:
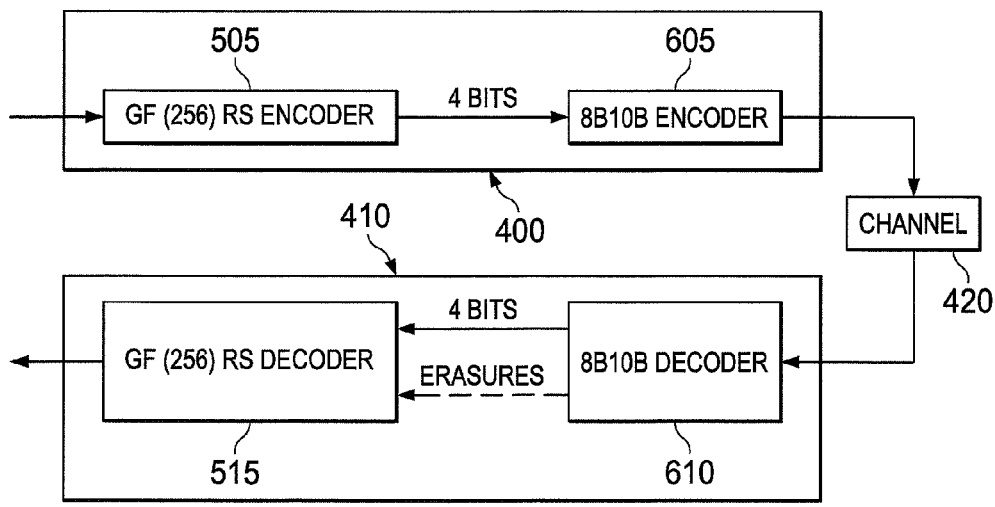
FIG. 6 illustrates a GF (256) Reed-Solomon code and 8B10B with concatenated scheme according to embodiments of the present disclosure.

FIG. 6 illustrates a GF (256) Reed-Solomon code and 8B10B with concatenated scheme according to embodiments of the present disclosure. The embodiment of the GF (256) Reed-Solomon code and 8B10B with concatenated scheme shown in FIG. 6 is for illustration only. Other embodiments could be used without departing from the scope of this disclosure.

In the example shown in FIG. 6, the transmitter 400 includes a GF (256) encoder 505 and a 8B10B encoder 605. In addition, the receiver 410 includes a 8B10B decoder 610 and a GF (256) RS decoder 515. The transmitter 400 communicates to the receiver 410 through channel 420. For example, the transmitter 400 and receiver 410 can communicate using visual light communication and the channel 420 can be within the visual light spectrum 100.

A problem when using Reed-Solomon that is constructed on different finite fields, is the need to implement different Reed-Solomon encoder 405, 505 and decoder 415, 515 circuits for each finite field, which includes building different circuits to do arithmetic operations over the different finite fields. For example, to implement the schemes in FIGS. 4 and 6 in the transmitter 400 requires two Reed-Solomon encoder circuits: one encoder operates over GF (16) 405 and the other operates over GF (256) 505. In addition, to implement the schemes in FIGS. 4 and 6 in the receiver 410 requires two Reed-Solomon decoder circuits: one encoder operates over GF (16) 415 and the other operates over GF (256) 515.

In some embodiments, the same encoder and decoder hardware are used to process Reed-Solomon constructed over different finite fields. The encoder and decoder are based on the following Theorem: In the finite field GF (p^n), GF (p^m) is a subfield of GF (p^n) if and only if m divides n. Note that 256=2^8 and 16=2^4. Since 4 divides 8, then GF (16) is a subfield of GF (256). That is, the GF (16) is a subset of GF (256). This means that it is possible to use the GF (256) Reed-Solomon encoder and decoder hardware to process the GF (16) Reed-Solomon codes as well.

GF (256) can be generated by $x^8+x^4+x^3+x^2+1$, which is a generator polynomial used for GF (256). However, another generator polynomial can be used without departing from the scope of this disclosure. Furthermore, $\alpha$ is used to denote a primitive element in GF (256) (that is, $\alpha$ generates all non-zero elements of GF (256) as $\alpha^0, \alpha^1, \ldots, \alpha^{254}$). In is noted that there are 15 non-zero elements in GF (16) and 255 non-zero elements in (256). Since 255/15=17, then $\alpha^{17}$ can generate all non-zero elements of GF (16). That is, $(\alpha^{17})^0, (\alpha^{17})^1, \ldots, (\alpha^{17})^{13}$ form the non-zero elements of GF (16)). The elements of GF (256) which form GF (16) and their additive forms are given in Table 1.

TABLE 1

ELEMENTS OF GF(256) THAT FORM GF(16)

| Power form | additive form ($\alpha^x$ = b1 b2 ... b8) | | | | | | | |
|---|---|---|---|---|---|---|---|---|
| ($\alpha^x$) | b1 | b2 | b3 | b4 | b5 | b6 | b7 | b8 |
| −1 | 0 | 0 | 0 | 0 | 0 | 0 | 0 | 0 |
| 0 | 1 | 0 | 0 | 0 | 0 | 0 | 0 | 0 |
| 17 | 0 | 0 | 0 | 1 | 1 | 0 | 0 | 1 |
| 34 | 0 | 1 | 1 | 1 | 0 | 0 | 1 | 0 |
| 51 | 0 | 1 | 0 | 1 | 0 | 0 | 0 | 0 |
| 68 | 1 | 0 | 0 | 1 | 1 | 0 | 0 | 1 |
| 85 | 0 | 1 | 1 | 0 | 1 | 0 | 1 | 1 |
| 102 | 0 | 0 | 1 | 0 | 0 | 0 | 1 | 0 |
| 119 | 1 | 1 | 0 | 0 | 1 | 0 | 0 | 1 |
| 136 | 1 | 1 | 1 | 1 | 0 | 0 | 1 | 0 |
| 153 | 0 | 1 | 0 | 0 | 1 | 0 | 0 | 1 |
| 170 | 1 | 1 | 1 | 0 | 1 | 0 | 1 | 1 |
| 187 | 0 | 0 | 1 | 1 | 1 | 0 | 1 | 1 |
| 204 | 1 | 0 | 1 | 1 | 1 | 0 | 1 | 1 |
| 221 | 1 | 0 | 1 | 0 | 0 | 0 | 1 | 0 |
| 238 | 1 | 1 | 0 | 1 | 0 | 0 | 0 | 0 |

As illustrated herein above, GF (16) is a subset of GF (256). Further, Table 1 illustrates the elements of GF (256) that form GF (16).

Embodiments of the present disclosure provide a mapping from the space of 4-bits symbols into the 8-bits symbols in Table 1. As shown in Table 1, b5 is identical to b8, b3 is identical to b7, b6 is always zero, and the vector [b1 b2 b3 b5] includes 16 different combinations in Table 1.

Figure 7A:
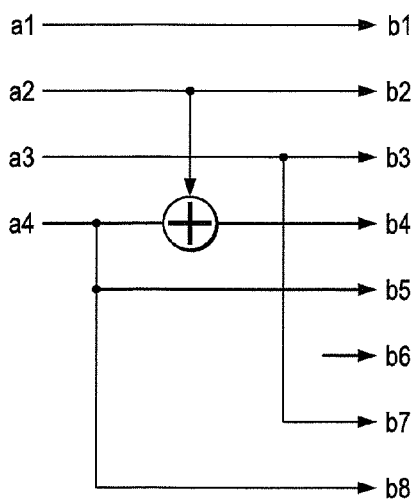
FIGS. 7A and 8A illustrate 4-to-8 bit mapping operations according to embodiments of the present disclosure.

Therefore, mapping from the space of 4-bits symbols, [a1 a2 a3 a4], into the 8-bits symbols in Table 1, [b1 b2 b3 b4 b5 b6 b7 b8] can be accomplished as indicated in FIG. 7A and Equations 1 through 8:

$$b1=a1 \qquad [\text{Eqn. 1}]$$

$$b2=a2 \qquad [\text{Eqn. 2}]$$

$$b3=a3 \qquad [\text{Eqn. 3}]$$

$$b4=a2 \oplus a4 \qquad [\text{Eqn. 4}]$$

$$b5=a4 \qquad [\text{Eqn. 5}]$$

$$b6=\text{zero} \qquad [\text{Eqn. 6}]$$

$$b7=a3 \qquad [\text{Eqn. 7}]$$

$$b8=a4 \qquad [\text{Eqn. 8}]$$

Figure 7B:
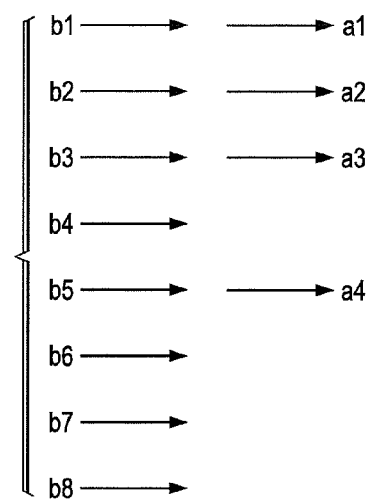
FIGS. 7B and 8B illustrate 8-to-4 bit demapping operations according to embodiments of the present disclosure

Further, as shown in Equations 1-8 and the example in FIG. 7A, the mapping includes only one xor operation. FIG. 7B illustrates the de-mapping from any 8-bits symbol in Table 1 into the space of 4-bits symbols is straightforward, a1=b1, a2=b2, a3=b3, and a4=b5. Another mapping operation example is provided in FIG. 8A with a corresponding demapping operation illustrated in FIG. 8B. Equations 9-16 illustrate the mapping and demapping operations for the examples in FIGS. 8A and 8B respectively.

$$b1=a1 \qquad [\text{Eqn. 9}]$$

$$b2=a2 \qquad [\text{Eqn. 10}]$$

$$b3=a3 \qquad [\text{Eqn. 11}]$$

$$b4=a4 \qquad [\text{Eqn. 12}]$$

$$b5=a2 \oplus a4 \qquad [\text{Eqn. 13}]$$

$$b6=\text{zero} \qquad [\text{Eqn. 14}]$$

$$b7=a3 \qquad [\text{Eqn. 15}]$$

$$b8=a2 \oplus a4 \qquad [\text{Eqn. 16}]$$

Figure 8A:
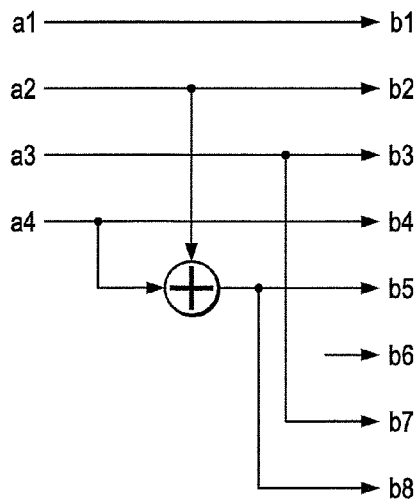
Figure 8B:
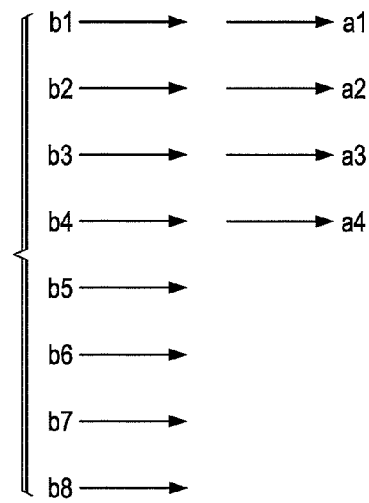

FIG. 8B illustrates the de-mapping from any 8-bits symbol in Table 1 into the space of 4-bits symbols is straightforward, a1=b1, a2=b2, a3=b3, and a4=b4.

Now, if $\beta=\alpha^{17}$, then $\beta$ is an element in GF (256), which is a primitive element in GF (16). Then the generator polynomial for the (15, k) Reed-Solomon code, $g_{16}(x)$, is the minimal polynomial with roots $\beta, \beta^2, \ldots, \beta^{n-k}$. It is important to keep in mind that the set $\psi=\{0, 1, \beta, \beta^2, \ldots, \beta^{13}\}$ are elements in GF (256) that form GF (16). Therefore, this set of elements is closed under addition, multiplication, and inverses. That is, adding or multiplying any two elements in $\psi$ is an element within $\psi$. In addition, the additive or the multiplicative inverse of any element in $\psi$ is also within $\psi$. Considering the mapping in FIGS. 7A and 8A above, data symbols at the input of the Reed-Solomon encoder are in $\psi$. Consequently, the codeword's symbols at the output of the Reed-Solomon encoder are within $\psi$.

Figure 9:
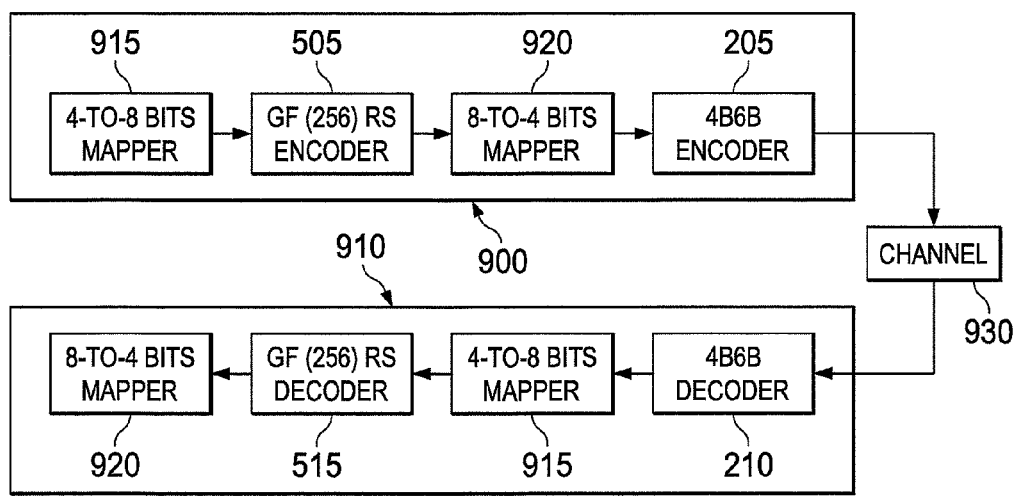
FIG. 9 illustrates a GF (16) RS coding scheme that operates on the GF (256) RS encoding and decoding circuits according to embodiments of the present disclosure.

FIG. 9 illustrates a GF (16) RS coding scheme that operates on the GF (256) RS encoding and decoding circuits according to embodiments of the present disclosure. The embodiment of the GF (16) RS coding scheme shown in FIG. 9 is for illustration only. Other embodiments could be used without departing from the scope of this disclosure.

In the example shown in FIG. 9, a transmitter 900 includes a 4-to-8 bits mapper 915, a GF (256) RS encoder 515, an 8-to-4 bits mapper 920 and a 4B6B encoder 205. A receiver 910 includes a 4B6B decoder 210, a 4-to-8 bits mapper 915, a GF (256) RS decoder 515, and an 8-to-4 bits mapper 920. The transmitter 900 communicates to the receiver 910 through channel 930. For example, the transmitter 900 and receiver 910 can communicate using visual light communication and the channel 930 can be within the visual light spectrum 100.

The GF (16) RS coding scheme is configured to use the FEC scheme. The GF (16) RS coding scheme includes only one xor gate at the transmitter 900 and one xor gate at the receiver 910 since the GF (256) Reed-Solomon encoder 505 and decoder 515 are already implemented to work with the 8B10B line-code.

Furthermore, the decoder arithmetic operations are also closed over $\psi$. Therefore, the search for the roots of the error-locator polynomial should be limited to the elements in $\psi$ (searching all elements of GF (256) also works, but need more time and energy).

In the transmitter, the 4-to-8 bits mapper 915 maps four bits into eight bits. For example, the 4-to-8 bits mapper 915 can map the four bits into eight bits using any one of the processes outlined with regards to FIGS. 7A and 8A. Thereafter, the 8-to-4 bits mapper 920 can use a corresponding demapping process, such as shown in FIGS. 7B and 8B.

In the receiver 910, the 4-to-8 bits mapper 915 maps four bits into eight bits. For example, the 4-to-8 bits mapper 915 can map the four bits into eight bits using any one of the processes outlined with regards to FIGS. 7A and 8A. Thereafter, the 8-to-4 bits mapper 920 can use a corresponding demapping process, such as shown in FIGS. 7B and 8B.

One of the proposed applications for visible light communication is for outdoor usage in vehicles and traffic lights. However, the outdoor usage is susceptible to severe channel impairments due to sunlight, mobility of vehicles and distance between the traffic lights and vehicles. Therefore, a strong error correcting codes for VLC is used for such applications, while simultaneously keeping the solution simple and low complexity.

In some examples, for channel coding (FEC) is the use of concatenated coding (convolutional code+RS code) for providing strong reliability during outdoor communication. Table 2 illustrates FEC options proposed in IEEE 802.15.7 for low rate PHY.

TABLE 2

FEC options proposed for low rate PHY

| | Optical rate | Modulation | Line coding | FEC | Data rate |
|---|---|---|---|---|---|
| PHY I | 200 kHz | OOK | Manchester | (15, 3) RS + ¼ CC | 5 kbps |
| | | | | (15, 7) RS + ¼ CC | 11.67 kbps |
| | | | | (15, 11) RS + ⅓ CC | 24.44 kbps |
| | | | | (15, 11) RS + ⅔ CC | 48.89 kbps |
| | | | | 1 | 100 kbps |
| | 400 kHz | VPM | 4B6B | (15, 2) RS | 35.56 kbps |
| | | | | (15, 4) RS | 71.11 kbps |
| | | | | (15, 7) RS | 124.4 kbps |
| | | | | 1 | 266.6 kbps |

Although the use of concatenated coding and RS coding is fairly common for error correction, the application of coding to VLC applications has some unique requirements. For example, the interleaver used for concatenated code design is typically a fixed block interleaver. However, vehicular applications for VLC require the use of very small frames (~50 bytes). Padding such small frames to fit into an interleaver boundary causes unnecessary overhead.

Figure 10:
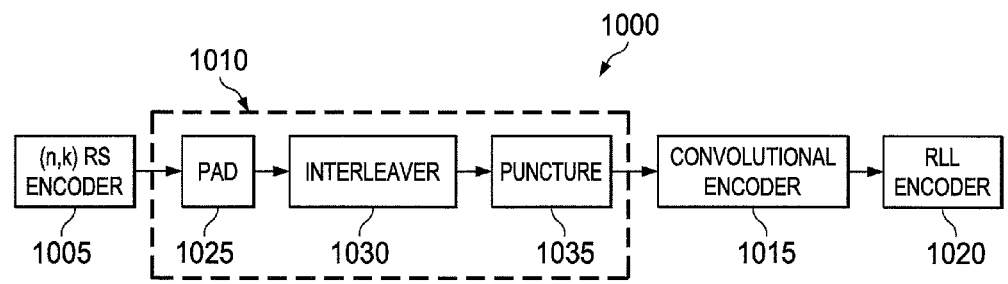
FIG. 10 illustrates a Reed-Solomon code concatenated with a convolutional code FEC scheme according to embodiments of the present disclosure.

FIG. 10 illustrates a Reed-Solomon code concatenated with a convolutional code FEC scheme according to embodiments of the present disclosure. The embodiment of the FEC scheme 1000 shown in FIG. 10 is for illustration only. Other embodiments could be used without departing from the scope of this disclosure.

The FEC scheme 1000 includes a Reed-Solomon encoder 1005. The Reed-Solomon (RS) encoder 1005 can be any Reed-Solomon encoder, such as described with respect to FIGS. 4 through 9. The RS encoder 1005 is an n, k encoder RS encoder where n is the RS codeword length and k is the number of information symbols in the RS codeword. The FEC scheme 1000 includes an interleaver unit 1010, a convolutional (CC) encoder 1015 and a run-length-limited (RLL) encoder 1020. The RLL encoder 1020 can be a Manchester RLL encoder. The interleaver unit 1010 can include a pad block 1025, a block interleaver 1030 and a puncture block 1035.

In the example shown in FIG. 10, the RS code is on GF(q). A frame of length $L_{frame}$ (in bytes) is passed to the RS encoder 1005. The RS encoder 1005 processes RS-symbols (or simply symbols), and each symbol consists of $\log_2(q)$ bits. The frame of length $L_{frame}$ includes a number of symbols as defined by Equation 17:

$$S_{frame} = \left\lceil \frac{L_{frame} * 8}{\log_2(q)} \right\rceil \qquad [\text{Eqn. 17}]$$

In Equation 17, q is the number of elements in the Galois field: GF(q); $L_{frame}$ denotes the input frame size in byte; $S_{frame}$ denotes the number of symbols at the input of the RS encoder; and S denotes the number of symbols from the output of the shortened RS encoder.

Every k symbols are encoded by the RS encoder 1005 to produce n symbols. If the number of remaining symbols falls short of k, the RS code is shortened appropriately. Consequently, a total of S symbols are output from the RS encoder 1005 as defined by Equation 18:

$$S = n * \left\lceil \frac{S_{frame}}{k} \right\rceil - (k - (S_{frame} \bmod k)) \quad \text{[Eqn. 18]}$$

Figure 11:
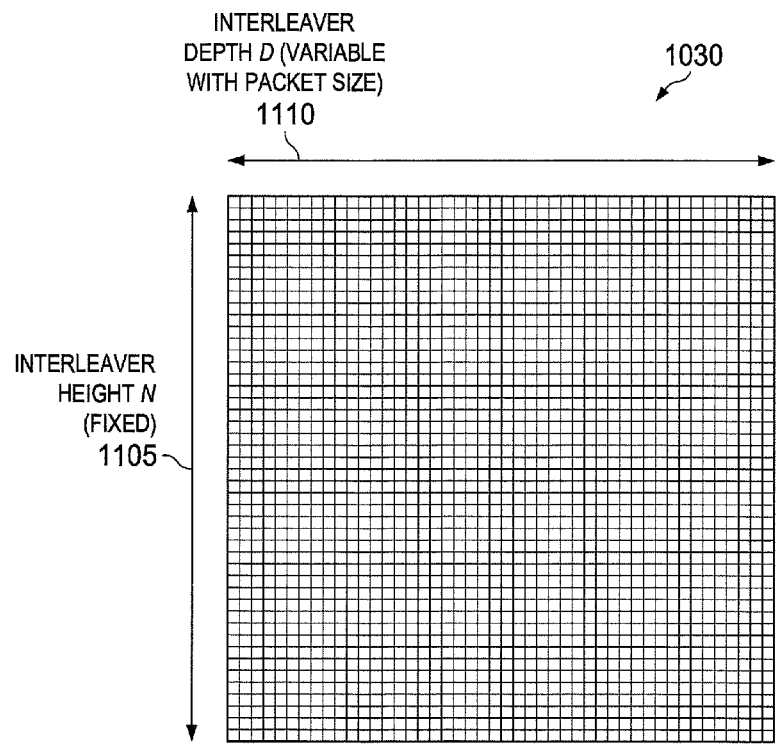
FIG. 11 illustrates a block interleaver 1030 according to embodiments of the present disclosure.

FIG. 11 illustrates a block interleaver 1030 according to embodiments of the present disclosure. The embodiment of the block interleaver 1030 shown in FIG. 11 is for illustration only. Other embodiments could be used without departing from the scope of this disclosure.

The block interleaver 1030 is a structured interleaver as opposed to a random interleaver. The block interleaver 1030 includes a fixed height of n 1105, which corresponds to the RS codeword length. The block interleaver 1030 includes a flexible depth D 1110, which is dependent upon the frame size as illustrated in Equation 19:

$$D = \left\lceil \frac{S}{n} \right\rceil \quad \text{[Eqn. 19]}$$

$$S_{block} = n * D. \quad \text{[Eqn. 20]}$$

$$p = n - (S \bmod n) \quad \text{[Eqn. 21]}$$

The flexible depth D is provided to optimize the block interleaver 1030 for short frame sizes to eliminate padding. When S is a multiple of n, there is no padding or puncturing. The RS encoder 1005 produces n symbols for every codeword, which are then sent to the interleaver unit 1010. When S is not multiple of n, p remaining symbols for the last codeword are padded with zero symbols and encoded to produce n symbols. After interleaving, the zero symbols are punctured out and are not transmitted.

The block interleaver 1030 can be defined by Equation 22, wherein l(i) is the interleaved indices:

$$l(i) = (i \bmod D) * n + \left\lfloor \frac{i}{D} \right\rfloor; \quad \text{[Eqn. 22]}$$
$$\text{for } i = 0, 1, \ldots, (S_{block} - 1)$$

In Equation 22, i is the ordered indices take the values 0, 1, ..., $S_{block}-1$ and $S_{block}$ is the size of the block interleaver 1030 used.

The locations of the p bits to be punctured by puncture block 1035 are given by Equation 23:

$$z(t)=(n-p+1)*D+t*D-1; \text{ for } t=0, 1, \ldots, p-1 \quad \text{[Eqn. 23]}$$

In Equation 23, t is the ordered indices take the values 0, 1, ..., p; and z(t) represents the locations of the bits to be punctured at the output of the interleaver before transmission.

Figure 12:
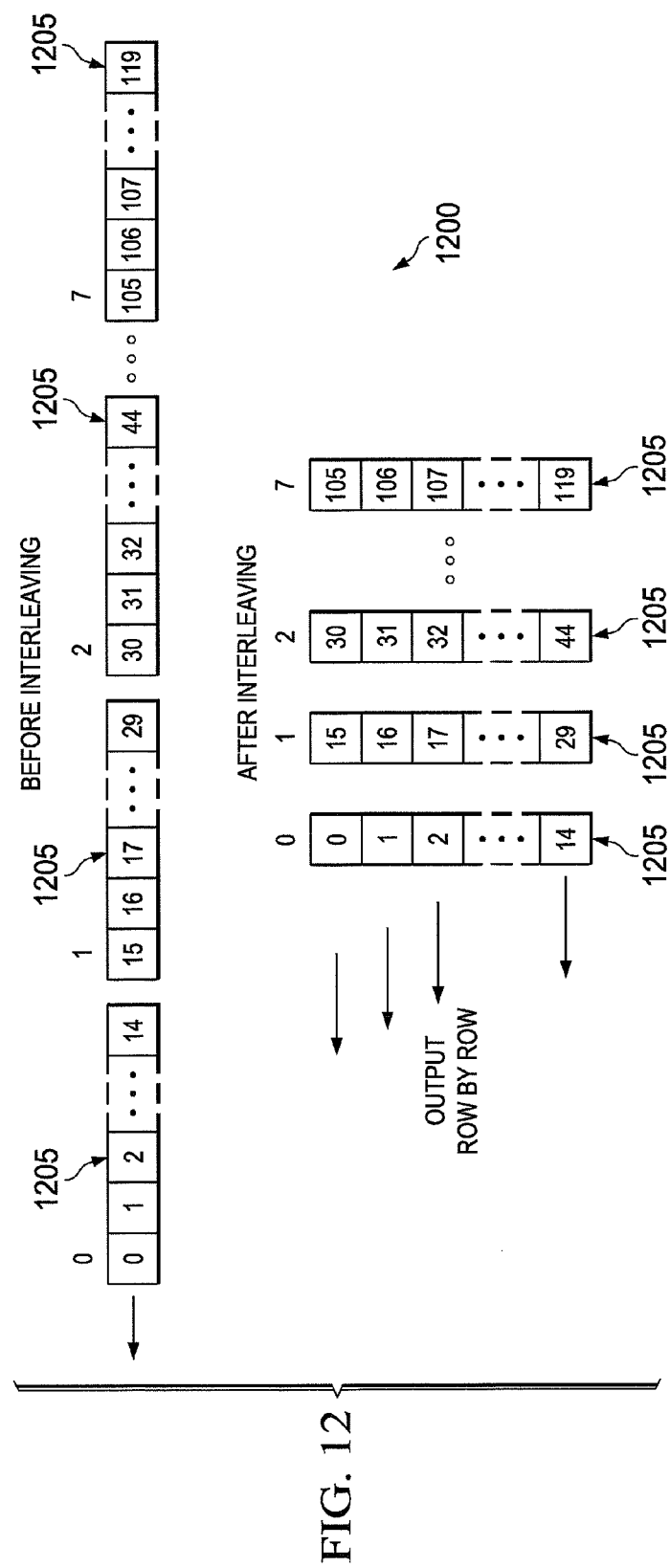
FIG. 12 illustrates an example interleaver operation according to embodiments of the present disclosure.

FIG. 12 illustrates an example interleaver operation according to embodiments of the present disclosure. The embodiment of the interleaver operation 1200 shown in FIG. 12 is for illustration only. Other embodiments could be used without departing from the scope if this disclosure.

In the example shown in FIG. 12, the (15, 12) RS code is on GF (16) and the frame, having a length of 48 bytes ($S_{frame}$=96 symbols), enters the RS encoder 1005. Then, a block of size S=120 symbols is obtained at the output of the encoder 1005. Therefore, N=15, D=120/15=8, $S_{block}$=120, p=0, and i=0, 1, ..., 119. Then, l(i)=[0, 15, 30, 45, 60, 75, 90, 105, 1, 16, 3, 46, 61, 76, 91, 106, 2, 17, 32, ..., 74, 89, 104, 119]. Therefore, the encoder 1005 outputs eight blocks (codewords 0-7) 1205, each with a length of 15 bits (e.g., 0-14, 15-29, 30-44 ... 105-119). The interleaver unit 1010 performs the interleaving operation and outputs the eight blocks 1205 by row.

Figure 13:
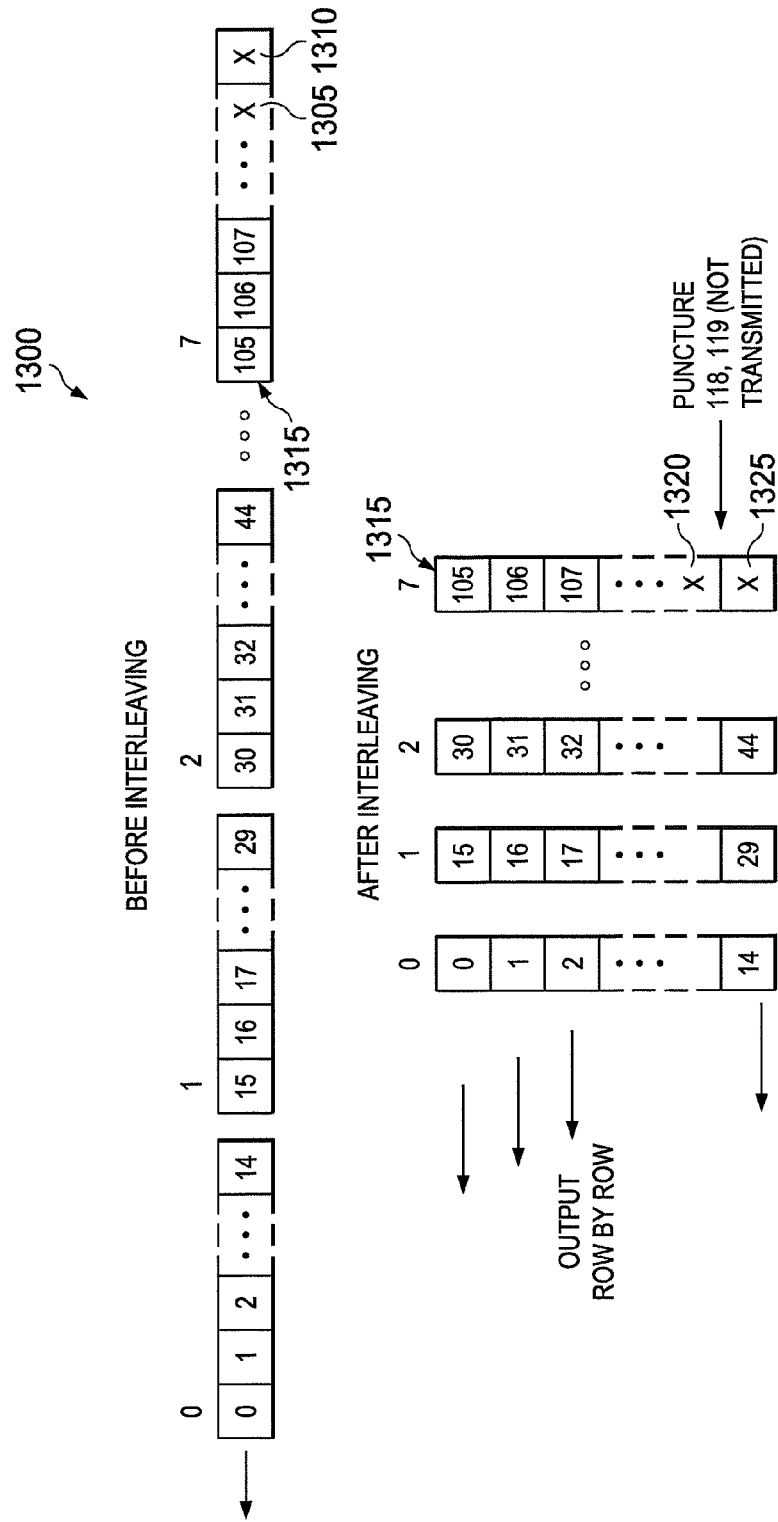
FIG. 13 illustrates another example interleaver operation according to embodiments of the present disclosure.

FIG. 13 illustrates another example interleaver operation according to embodiments of the present disclosure. The embodiment of the interleaver operation 1300 shown in FIG. 13 is for illustration only. Other embodiments could be used without departing from the scope if this disclosure.

In the example shown in FIG. 13, the (15, 12) RS code is on GF (16) and the frame has a length of 47 bytes. Therefore, $S_{frame}$=94 symbols. Then, S=118, D=8, $S_{block}$=120, p=2, and i=0, 1, ..., 119. Therefore, the pad block 1025 pads the symbol with 2 bits 1305, 1310 in the seventh codeword 1415. Then, l(i)=[0, 15, 30, 45, 60, 75, 90, 105, 1, 16, 3, 46, 61, 76, 91, 106, 2, 17, 32, ..., 74, 89, 104, 119]. The puncture block 1035 performs a puncturing operation at puncturing locations 1320, 1325 in the seventh codeword 1315. The puncturing locations 1320, 1325 to be punctured from l(i) are: Z(0)=111, Z(1)=119.

The length of the frame is communicated to the receiver in the header so that the receiver can adaptively adjust the interleaver 1030 based on the frame sizes. When the data rates corresponding to the robust transmissions using the concatenated codes are used, the header shall also be interleaved according to the above procedure. Since the length of the header is fixed, the receiver can deinterleave the header without explicit transmission of the header length.

In some embodiments, the puncturing is not performed and the additional 'p' pad symbols 1305, 1310 are also transmitted.

In some embodiments, the last (S mod n) symbols of the shortened RS code are not interleaved. No padding is performed and, as such, no puncturing is performed. In this case, $$D = \left\lfloor \frac{S}{n} \right\rfloor \quad \text{[Eqn. 16]}$$

And;

$$l(i) = \begin{cases} (i \bmod D)*n + \left\lfloor \frac{i}{D} \right\rfloor; & \text{for } i = 0, 1, \ldots, (n*D-1) \\ i; & \text{for } i = n*D, \ldots, (S-1) \end{cases} \quad \text{[Eqn. 17]}$$

For example, considering the example shown in FIG. 14, where $S_{frame}$=94 symbols; now, $S_{block}$=118, then D=7. In this case the interleaver block 1030 interleaves the first 105 symbols while not interleaving the last 13 symbols.

In some embodiments, the interleaver block 1030 is constrained such that the interleaver size is constrained to a maximum value $S_{max}$. To accommodate the case when $S_{block}>S_{max}$, the interleaver block 1030 interleaves a block of $S_{block}$ symbols, B=[b(0), b(1), ..., b($S_{block}$−1)]=[$s_0, s_1, \ldots, s_{sblock-1}$], as follows:

If $S_{block} \leq S_{max}$
  B'=B(l(i))=[b(l(0)), b(l(1)), ..., b(l($S_{block}$−1))];
Else if $S_{block} > S_{max}$
  %% divide B into X sub-blocks each of size $S_1$ except the last sub-block, which will be of size $S_2$.
  C=ceil($S_{block}$/n),
  X=ceil(C*n/$S_{max}$);
  $S_1$=ceil(C/X)*n;
  $S_2=S_{block}-S_1*(X-1)$;
  For x=0, ..., X−2, %% interleave each sub-block $B_x$
    $B_x$'=$B_x$(l(i))=[b(x*$S_1$+l(0)), b(x*$S_1$+l(1)), ..., b(x*$S_1$+l($S_1$−1))];

End
$B_{x-1}' = B_{x-1}(l(i)) = [b((X-1)*S_2+l(0)), b((X-1)*S_2+l(1)), \ldots, b((X-1)*S_2+l(S_2-1))]$;
End The interleaving procedure described above works well when N is relatively small (which is the case in the targeted application in IEEE 802.15.7). However, if n is larger than some threshold, $N_{max}$, then the RS codewords can be divided into sub-codewords of equal size. For example, the RS encoder 1005, the pad block 1025 or the block interleaver 1030 can divide the RS codewords. Then, the interleaver process described hereinabove is used, however, instead of using n as the length of the RS codeword, n is used as the length of the RS sub-codeword.

For example, when the block includes a length $S_{block}=165$, and $S_{max}=120$, then the block interleaver 1030 performs the interleaving procedure above by dividing the block into two sub-blocks: one block with length 90, and the other with length 75. Then, the block interleaver 1030 interleaves each sub-block separately similar to as described with respect to FIG. 13.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a visual light communications network, a transmitter comprising:
    a Reed Solomon (RS) encoder; and
    an interleaver unit configured to receive, from the RS encoder, a plurality of symbols as a plurality of codewords, the interleaver unit comprising:
        a pad block;
        a block interleaver; and
        a puncture block, wherein the interleaver unit is configured to receive a plurality of symbols as a plurality of codewords and interleave the plurality of codewords, wherein the pad block is configured to add a number of bits to at least one codeword based on a frame size of the plurality of symbols and wherein the puncture block is configured to puncture a number of bits based on the frame size.

2. The transmitter as set forth in claim 1, wherein the block interleaver comprises a fixed height n and a flexible depth D, and wherein the flexible depth D is dependent on the frame size.

3. The transmitter as set forth in claim 2, wherein the height n is equal to a reference symbol block length and the depth is computed using an equation from one of:

$$S_{frame} = \left\lceil \frac{L_{frame} * 8}{\log_2(q)} \right\rceil$$

$$S = n * \left\lceil \frac{S_{frame}}{k} \right\rceil - (k - (S_{frame} \bmod k)); \text{ and}$$

$$D = \left\lceil \frac{S}{n} \right\rceil.$$

4. The transmitter as set forth in claim 2, wherein the flexible depth of the block interleaver and the puncturing block after the block interleaver are configured to minimize a padding overhead.

5. The transmitter as set forth in claim 2, wherein the block interleaver is configured to interleave the plurality of codewords using an equation defined by:

$$l(i) = (i \bmod D) * n + \left\lfloor \frac{i}{D} \right\rfloor; \text{ for } i = 0, 1, \ldots, (S_{block} - 1)$$

where i is an ordered indices using values $0, 1, \ldots, S_{block}-1$ and $S_{block}$ is a size of the block interleaver.

6. The transmitter as set forth in claim 1, wherein the puncture block is configured to determine a location of the number of bits to be punctured based on an equation defined by:

$$z(t) = (n-p+1)*D + t*D - 1; \text{ for } t = 0, 1, \ldots, p-1,$$

wherein t is an ordered indices using values $0, 1, \ldots, p$; and z(t) represents the locations of the number of bits to be punctured at the output of the block interleaver prior to transmission.

7. The transmitter as set forth in claim 1, wherein the transmitter is configured to communicate, to a receiver, a length of the frame in a header so that the receiver can adaptively adjust the interleaver based on the frame size.

8. The transmitter as set forth in claim 7, wherein the header is interleaved using a predetermined length in a same procedure as a data of the frame.

9. For use in a visual light communications network, a method for performing Galois Field (GF) (16) and GF (256) encoding, the method comprising:
    mapping a GF (16) code to a four bit to six bit (4B6B) line encoder;
    mapping a first GF(256) code to a eight bit to ten bit (8B10B) line encoder; and
    mapping a second GF(256) to two 4B6B line encoders.

10. The method as set forth in claim 9, further comprising:
    marking errors from at least one of the line encoders as erasures in a receiver; and
    forwarding the erasures to a Reed Solomon (RS) decoder for performance improvement.

11. The method as set forth in claim 9, further comprising shortening where the RS codes to fix parity symbols to 32 for hardware complexity and reduction and to adapt a rate based on a changing number of data symbols.

12. The method as set forth in claim 9, further comprising:
    mapping a first number of bits to a second number of bits;
    performing a Galois Field (256) encoding operation on the second number of bits; and
    mapping the second number of bits to the first number of bits, wherein the first number of bits is four and the second number of bits is eight.

13. The method as set forth in claim 12, wherein mapping the first number of bits to the second number of bits comprises a single exclusive or operation.

14. For use in a visual light communications network, a method for interleaving frames, the method comprising:
    receiving a plurality of symbols as a plurality of codewords;
    padding the plurality of symbols by adding a number of bits to at least one codeword based on a frame size of the plurality of symbols;
    interleaving the plurality of codewords, and
    puncturing a number of bits based on the frame size.

15. The method as set forth in claim 14, wherein interleaving comprises using an equation defined by:

$$l(i) = (i \bmod D) * n + \left\lfloor \frac{i}{D} \right\rfloor; \text{ for } i = 0, 1, \ldots, (S_{block} - 1)$$

where i is an ordered indices using values $0, 1, \ldots, S_{block}-1$ and $S_{block}$ is a size of the block interleaver.

16. The method as set forth in claim 14, wherein puncturing comprises determining a location of the number of bits to be punctured based on an equation defined by:

$$z(t)=(n-p+1)*D+t*D-1; \text{ for } t=0, 1, \ldots, p-1,$$

wherein t is an ordered indices using values $0, 1, \ldots, p$; and $z(t)$ represents the locations of the number of bits to be punctured at the output of the block interleaver prior to transmission.

17. The method as set forth in claim 14, wherein interleaving comprises a fixed height n and a flexible depth D, the flexible depth D dependent on the frame size.

18. The method as set forth in claim 17, wherein the height n is equal to a reference symbol block length and the depth is computed using equations defined as:

$$S_{packet} = \left\lceil \frac{L_{packet} * 8}{\log_2(q)} \right\rceil$$

$$S = n * \left\lceil \frac{S_{packet}}{k} \right\rceil - (k - (S_{packet} \bmod k)); \text{ and}$$

$$D = \left\lceil \frac{S}{n} \right\rceil.$$

19. The method as set forth in claim 17, wherein the flexible depth of interleaving and the puncturing after the interleaving are configured to minimize a padding overhead.

20. A transmitter capable of performing Galois Field (GF) (16) and GF (256) encoding, the transmitter comprising:

a first bit mapper configured to map a first number of bits to a second number of bits;

a Galois Field (256) encoder, wherein the Galois Field (256) encoder is configured to receive and encode the second number of bits; and a second bit mapper configured to map the second number of bits to the first number of bits.

21. The transmitter as set forth in claim 20, wherein the first number of bits is four and the second number of bits is eight, and wherein the first bit mapper is configured to map the four bits to the eight bits using the plurality of equations, the plurality of equations comprising a single exclusive or operation

* * * * *